(12) United States Patent
Li et al.

(10) Patent No.: US 11,107,717 B2
(45) Date of Patent: Aug. 31, 2021

(54) WAFER BOX CONVEYOR

(71) Applicant: SHANGHAI MICRO ELECTRONICS EQUIPMENT (GROUP) CO., LTD., Shanghai (CN)

(72) Inventors: Lingyu Li, Shanghai (CN); Qixin Xu, Shanghai (CN)

(73) Assignee: SHANGHAI MICRO ELECTRONICS EQUIPMENT (GROUP) CO., LTD., Shanghai (CN)

(*) Notice: Subject to any disclaimer, the term of this patent is extended or adjusted under 35 U.S.C. 154(b) by 152 days.

(21) Appl. No.: 16/097,551

(22) PCT Filed: Apr. 28, 2017

(86) PCT No.: PCT/CN2017/082408
§ 371 (c)(1),
(2) Date: Oct. 29, 2018

(87) PCT Pub. No.: WO2017/186166
PCT Pub. Date: Nov. 2, 2017

(65) Prior Publication Data
US 2019/0206709 A1   Jul. 4, 2019

(30) Foreign Application Priority Data
Apr. 29, 2016   (CN) .......................... 201610285760.0

(51) Int. Cl.
*H01L 21/677*   (2006.01)
*H01L 21/67*   (2006.01)
*G01S 15/931*   (2020.01)

(52) U.S. Cl.
CPC ...... *H01L 21/67724* (2013.01); *G01S 15/931* (2013.01); *H01L 21/6773* (2013.01);
(Continued)

(58) Field of Classification Search
CPC .. H01L 21/67724; H01L 21/6773; B60P 1/00; G01S 15/931
See application file for complete search history.

(56) References Cited

U.S. PATENT DOCUMENTS

| 5,938,710 A | 8/1999 | Lanza et al. |
| 2003/0059289 A1* | 3/2003 | Yap .................. H01L 21/67775 414/541 |

(Continued)

FOREIGN PATENT DOCUMENTS

| CN | 1757578 A | 4/2006 |
| CN | 205723481 U | 11/2016 |

(Continued)

*Primary Examiner* — Saul Rodriguez
*Assistant Examiner* — Willie Berry, Jr.
(74) *Attorney, Agent, or Firm* — Muncy, Geissler, Olds & Lowe, P.C.

(57) ABSTRACT

A cassette transport device is disclosed which includes a smart cart, a base expansion frame mounted on the smart cart and a cassette-loading frame fixed to the base expansion frame. The cassette-loading frame is partitioned into several segments each accommodating a plurality of cassette trays. Each of the cassette trays defines, on its surface, a first trough and a second trough in the first trough. The first trough is configured to retain a cassette of a first size, and the second trough is configured to retain a cassette of a second size. With the first and second troughs, each of the cassette trays is able to retain a cassette of either the first or second size, making the cassette transport device possible to be used in transportation of the both types of cassettes with a high yield. Moreover, the smart cart is capable of automated transportation without human intervention or track construction while enabling savings in transportation cost, time and labor.

12 Claims, 3 Drawing Sheets

(52) U.S. Cl.
CPC .. *H01L 21/67294* (2013.01); *H01L 21/67706* (2013.01); *H01L 21/67769* (2013.01); *H01L 21/67775* (2013.01)

(56) References Cited

U.S. PATENT DOCUMENTS

| | | |
|---|---|---|
| 2008/0030341 A1 | 2/2008 | Zhuang |
| 2012/0321423 A1 | 12/2012 | MacKnight |
| 2015/0234378 A1* | 8/2015 | Fosnight ............ G05B 19/4184 700/121 |

FOREIGN PATENT DOCUMENTS

| | | |
|---|---|---|
| JP | H11222121 A | 8/1999 |
| JP | 2000095350 A | 4/2000 |
| JP | 2001068523 A | 3/2001 |
| JP | 2003243474 A | 8/2003 |
| JP | 2005197431 A | 7/2005 |
| JP | 2005327927 A | 11/2005 |
| JP | 2006108145 A | 4/2006 |
| JP | 2013125957 A | 6/2013 |
| KR | 20040021985 A | 3/2004 |
| KR | 20070066492 A | 6/2007 |
| TW | 200633915 A | 10/2006 |
| TW | 200640766 A | 12/2006 |
| TW | M441929 | 11/2012 |

* cited by examiner

WAFER BOX CONVEYOR

TECHNICAL FIELD

The present invention relates to the field of transportation and, in particular, to a cassette transport device.

BACKGROUND

With the development of semiconductor technologies, 300 mm wafers will gradually replace 200 mm wafers to become the mainstream. Accordingly, the total weight of a wafer cassette fully loaded with wafers will increase from about 4 kg to about 8 kg, subjecting manual handling and transportation to low efficiency and the risk of operator injuries. Traditionally, such cassettes are transported manually using trolleys or carts. This approach is, however, associated with a number of drawbacks including low transportation efficiency, intensive labor, heavy contamination, a low degree of automation and great turning radii. These deficiencies are getting worse and worse in the context of increasingly demanding requirements for higher utilization of semiconductor fabrication plants (fabs).

In order to overcome the above problems, most contemporary 300-mm fabs employ automated material handling systems (AMHSs) in which overhead hoist transfer (OHT) vehicles follow overhead tracks to transport wafer cassettes between process equipment and temporary storage shelves. However, such systems are not affordable to most traditional semiconductor manufacturers because they require expensive fab retrofits for constructing AMHS tracks and other supporting facilities.

SUMMARY OF THE INVENTION

It is an objective of the present invention to overcome the above problem of requiring expensive construction of AMHS tracks for cassette transportation by providing a cassette transport device.

To this end, the cassette transport device provided in the present invention including a smart cart; a base expansion frame mounted on the smart cart; and a cassette-loading frame fixed to the base expansion frame, the cassette-loading frame being partitioned into several segments each accommodating a plurality of cassette trays, wherein each of the cassette trays defines, on a surface thereof, a first trough and a second in the first trough, the first trough being configured to retain a cassette of a first size, the second trough being configured to retain a cassette of a second size.

Optionally, in the cassette transport device, the second trough may be provided with at least two spring-based locking assemblies.

Optionally, in the cassette transport device, the second trough may be provided with four spring-based locking assemblies disposed at respective four corners of the second trough.

Optionally, in the cassette transport device, the first trough may be provided with at least three pin-based locking assemblies.

Optionally, in the cassette transport device, the first trough may be provided with three pin-based locking assemblies disposed to define a triangle.

Optionally, in the cassette transport device, each of the cassette trays may be provided with at least three stress sensors on a backside thereof, the at least three stress sensors being not arranged on a same line.

Optionally, in the cassette transport device, each of the cassette trays may be provided with three stress sensors on a backside thereof, the three stress sensors being disposed on a backside of the second trough corresponding to three edges of the second trough.

Optionally, in the cassette transport device, each of the cassette trays may be further provided with at least one photoelectric sensor on a backside thereof, the at least one photoelectric sensor configured for detecting presence of cassettes.

Optionally, in the cassette transport device, the cassette-loading frame may be provided with RFID sensors for obtaining ID information of cassettes.

Optionally, in the cassette transport device, each of the RFID sensors may include two antennas for obtaining ID information of the cassettes, one of the two antennas configured for detecting the cassette of the first size and the other one of the two antennas configured for detecting the cassette of the second size.

Optionally, in the cassette transport device, a plurality of buffers may be disposed between the smart cart and the base expansion frame.

Optionally, the cassette transport device may further include a plurality of obstacle avoidance sensors.

Optionally, in the cassette transport device, the plurality of obstacle avoidance sensors may include: ultrasonic sensors, horizontal sensors and vertical sensors, the ultrasonic sensors being disposed in symmetry on front and rear sides of the base expansion frame that oppose each other along a direction in which the smart cart travels, the horizontal sensors being disposed in symmetry on left and right sides of the base expansion frame, the vertical sensors being disposed in symmetry on left and right sides of the cassette-loading frame.

Optionally, in the cassette transport device, the first size may be 12 inch and the second size may be 8 inch.

In the cassette transport device of the present invention including the smart cart, the base expansion frame mounted on the smart cart and the cassette-loading frame fixed to the base expansion frame, the cassette-loading frame is partitioned into several segments each accommodating multiple cassette trays, and each of the cassette trays defines, on its surface, a first trough for retaining a cassette of a first size a second trough that is surrounded by the first trough and configured to retain a cassette of a second size. With the first and second troughs, each of the cassette trays is able to retain a cassette of either the first or second size, making the cassette transport device possible to be used in transportation of the both types of cassettes with a high yield. Moreover, the smart cart is capable of automated transportation without human intervention or track construction while enabling savings in transportation cost, time and labor.

In these figures, 1—smart cart; 2—cassette-loading frame; 10—support plate; 20—cassette tray; 201—first trough; 211—spring-based locking assembly; 212—pin-based locking assembly; 202—second trough; 203—stress sensor; 204—photoelectric sensor; 3—base expansion frame; 4—cassette; 9—ultrasonic sensor; 5—horizontal sensor; 6—vertical sensor; 7—antenna in a RFID sensor; 8—RFID tag.

DETAILED DESCRIPTION OF PREFERRED EMBODIMENTS

The cassette transport device proposed in the present invention will be further described with reference to the following detailed description of several particular embodiments thereof, which is to be read in connection with the accompanying drawings. Features and advantages of the invention will be more apparent from the following detailed description, and from the appended claims. It is noted that the figures are provided in a very simplified form and not necessarily drawn to scale, with the only intention to facilitate convenience and clarity in explaining the embodiments.

Embodiment 1

Figure 1:
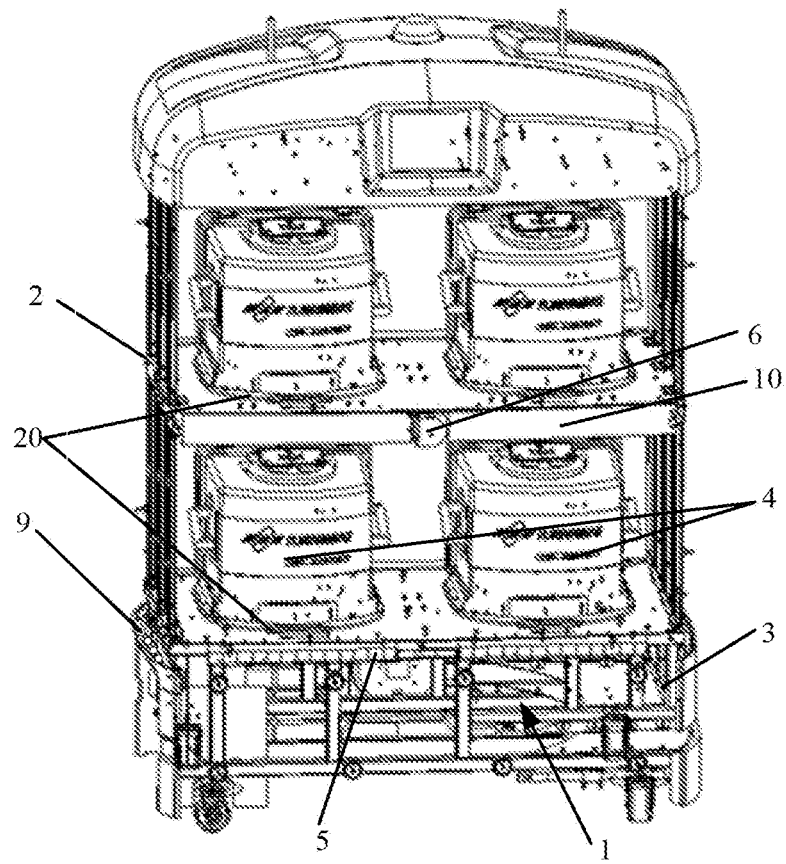
FIG. 1 is a schematic view of a cassette transport device according to a first embodiment of the present invention.
Figure 3A:
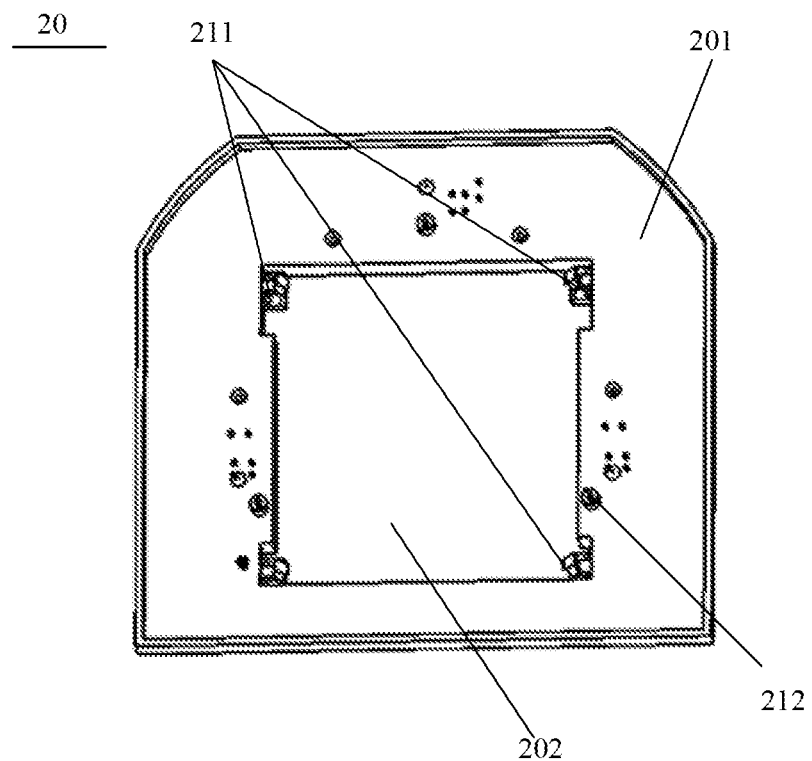
FIGS. 3a to 3b are schematic views of a cassette tray according to the first embodiment or a second embodiment of the present invention.

Referring to FIGS. 1 and 3a, the cassette transport device includes: a smart cart 1; a base expansion frame 3 mounted on the smart cart 1; and a cassette-loading frame 2 fixed to the base expansion frame 3. The cassette-loading frame 2 is partitioned into several segments by support plates 10. Each of the support plates 10 bears a number of cassette trays 20. As shown in FIG. 3a, each of the cassette trays 20 defines, on its surface, a first trough 201 and a second trough 202 within the first trough 201. The first trough 201 corresponds to a cassette 4 of the first size, and the second trough 202 corresponds to a cassette 4 of the second size that is smaller than the first size. Preferably, at least two cassette trays 20 are borne on each of the support plates partitioning the cassette-loading frame 2 into several segments in order to achieve a high load capacity per trip and high transportation efficiency.

The first and second troughs 201, 202 are designed according to the cassettes 4 of the first and second sizes, respectively. The first and second troughs 201, 202 may include walls to prevent dislodgement of the cassettes 4 therefrom. In this way, a single cassette tray 20 is capable of transferring a cassette 4 of either the first or second size, allowing the device to have high flexibility and utilization. In this Embodiment, the first size is 12", and the second size is 8". Of course, the cassette trays 20 may also be adapted to other cassette sizes by corresponding trough designs. This can be readily appreciated by those of ordinary skill in the art and will not be described in further detail herein.

Figure 3B:
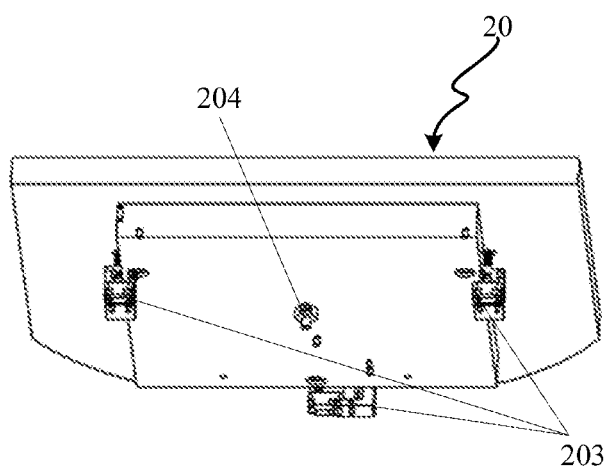

Referring to FIGS. 3a to 3b, the second trough 202 may be provided with at least two spring-based locking assemblies 211. The at least two spring-based locking assemblies 211 cooperate for positional fixation of a cassette 4 of the second size so that the cassette 4 can be retained firmly in the second trough 202. Preferably, the second trough may be provided with four spring-based locking assemblies 211, and the four spring-based locking assemblies 211 are provided at the respective corners of the second trough.

The first trough 201 may be provided with at least three pin-based locking assemblies 212. The at least three pin-based locking assemblies 212 work together to ensure positional fixation of a cassette 4 of the first size. Preferably, three pin-based locking assemblies 212 are provided to define a triangle. The pin-based locking assemblies 212 may cooperate with respective corresponding grooves on the bottom of the cassette 4 to lock the cassette 4.

Referring to FIG. 3b, on a backside of the cassette tray 20 may be disposed at least three stress sensors 203 and at least one photoelectric sensor 204. The stress sensors are arranged non-linearly in order to detect whether the cassette 4 is tilted, and the photoelectric sensor 204 is configured to detect the presence of the cassette 4 so as to reduce placement errors of the cassette 4. In this Embodiment, three stress sensors 203 are provided, and the three stress sensors 203 are arranged at respective bottom edges of a backside of the second trough 202.

In this Embodiment, the cassette transport device further includes a plurality of obstacle avoidance sensors as well as a plurality of buffers disposed between the smart cart 1 and the base expansion frame 3. The base expansion frame 3 may serve as a peripheral expansion of the smart cart 1 to increase the load capacity of the smart cart 1 and improve transportation efficiency. The buffers can reduce vibration of the cassette-loading frame 2 during travelling of the smart cart 1 so as to avoid damage to wafers in the loaded cassettes.

Further, referring again to FIG. 1, the obstacle avoidance sensors may include ultrasonic sensors 9, horizontal sensors 5 and vertical sensors 6. The ultrasonic sensors 9 are disposed in symmetry on front and rear sides of the base expansion frame 3 that oppose each other along the direction in which the smart cart 1 travels. Herein, the front side refers to the side of the base expansion frame 3 pointing toward the direction in which the smart cart 1 is advancing, while the rear side refers to the side thereof opposing the front side. The horizontal sensors 5 are disposed in symmetry on left and right sides of the base expansion frame 3. Herein, the left side refers to the side of the base expansion frame 3 on the left with respect to the advancement direction of the smart cart 1, while the right side refers to the side thereof opposing the left side. The vertical sensors are disposed in symmetry on left and right sides of the cassette-loading frame 2. The ultrasonic sensors 9 are configured to detect obstacles in front of and behind the smart cart 1 within a preset range. The horizontal sensors 5 are configured to detect obstacles in front of and behind the smart cart 1 in a horizontal direction, and the vertical sensors 6 are configured to detect obstacles for the smart cart 1 in a vertical direction. The horizontal and vertical sensors 5, 6 all have a maximum detection range of 270°. Preferably, the number of the horizontal sensors 5 is four. In order to ensure safety and reliability of the smart cart 1, the cassette transport device may be configured to cross any obstacle not taller than 20 mm and bypass any obstacle taller than 20 mm.

Figure 2:
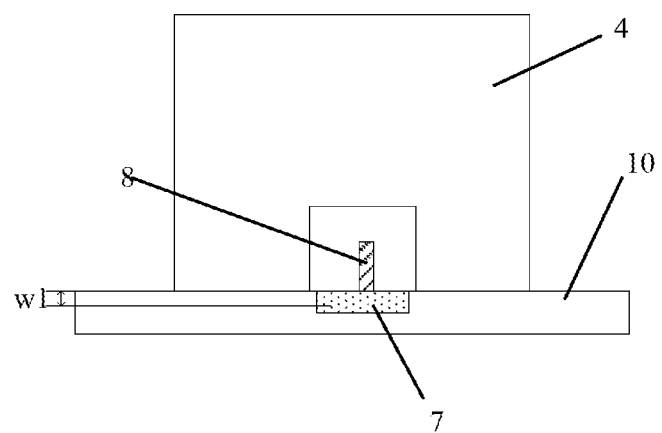
FIG. 2 schematically illustrates the authentication of a 12" cassette by an RFID sensor in accordance with the first embodiment of the present invention.

Furthermore, the cassette transport device may further include RFID sensors each capable of authenticating both 8" and 12" cassettes. The RFID sensors may be disposed on the cassette-loading frame 2 to read an identifier (i.e., ID information) of a cassette upon it being placed on the smart cart 1. The RFID sensor may include two antennas for obtaining ID information of cassettes 4, respectively, of the first and second sizes. Referring to FIG. 2, a 12" cassette 4 with an RFID tag 8 is placed on a cassette tray 20, with the tag being located on the side of the cassette-loading frame 2 where cassettes are handled. The first cassette size specific antenna 7 in a corresponding one of the RFID sensors is arranged on the support plate 10 bearing the cassette tray 20 so that it is right under the cassette tray 20 and closer to the RFID tag 8. It is configured that the antenna 7 in the RFID sensor can adequately sense the RFID tag 8 when the distance between them is in the range of 0-10 mm.

Embodiment 2

Figure 4A:
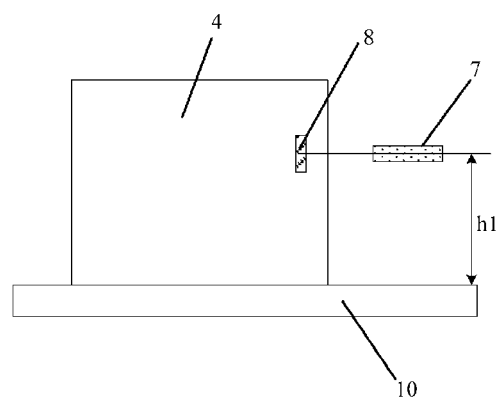
FIGS. 4a to 4b schematically illustrate the authentication of an 8" cassette by an RFID sensor in accordance with the second embodiment of the present invention.
Figure 4B:
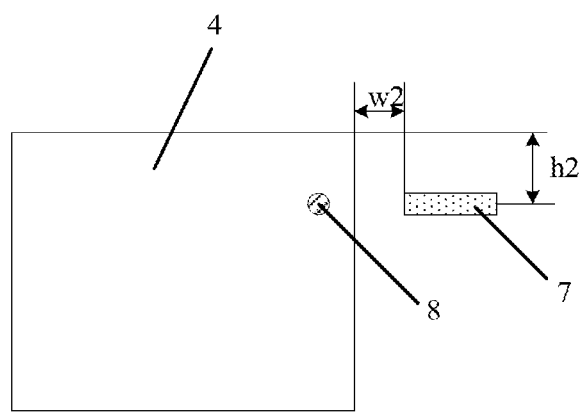

Reference is now made to FIGS. 4a to 4b, in which FIG. 4a is a front view showing the authentication of an 8" cassette 4, and FIG. 4b is a top view of FIG. 4a. As shown, the 8" cassette attached with a RFID tag 8 is placed on a cassette tray 20, with the tag being so located that a line connecting it to a center of the cassette is perpendicular to a cassette loading/unloading direction of the cassette-loading frame 2. Meanwhile, the second cassette size specific antenna 7 in a corresponding one of the RFID sensors is disposed on the cassette-loading frame 2 such that it is in the vicinity of the RFID tag 8. Specifically, the antenna 7 in the RFID sensor is spaced horizontally from the RFID tag 8 by a distance w2 of 0-10 mm, vertically from the support plate 10 bearing the cassette tray 20 by a distance h1 of 120-150 mm (with a tolerance of 5 mm), and horizontally from the side of the cassette-loading frame 2 opposing the side thereof where cassettes are handled by a distance h2 of 40 mm (with a tolerance of 3 mm).

To sum up, in the cassette transport device of the present invention including the smart cart, the base expansion frame mounted on the smart cart and the cassette-loading frame fixed to the base expansion frame, the cassette-loading frame is partitioned into several segments each accommodating multiple cassette trays, and each of the cassette trays defines, on its surface, a first trough for retaining a cassette of a first size a second trough that is surrounded by the first trough and configured to retain a cassette of a second size. With the first and second troughs, each of the cassette trays is able to retain a cassette of either the first or second size, making the cassette transport device possible to be used in transportation of the both types of cassettes with a high yield. Moreover, the smart cart is capable of automated transportation without human intervention or track construction while enabling savings in transportation cost, time and labor.

The embodiments disclosed herein are described in a progressive manner, with the description of each embodiment focusing on its differences from the other embodiment(s). Reference can be made between the embodiments for a detail description of any feature common or essentially common to them.

The description presented above is merely that of a few preferred embodiments of the present invention and does not limit the scope thereof in any sense. Any and all changes and modifications made by those of ordinary skill in the art based on the above teachings fall within the scope as defined in the appended claims.

What is claimed is:

1. A cassette transport device, comprising:
a smart cart;
a base expansion frame mounted on the smart cart; and
a cassette-loading frame fixed to the base expansion frame, the cassette-loading frame being partitioned into several segments each accommodating a plurality of cassette trays,
wherein each of the plurality of cassette trays defines, on a surface thereof, a first trough having a first size and a second trough having a second size different from the first size, the second trough being embodied in the first trough, the first trough being configured to retain a cassette of the first size, the second trough being configured to retain a cassette of the second size,
wherein each of the plurality of cassette trays is provided with three stress sensors on a backside thereof, the three stress sensors are configured for detecting whether the cassette is tilted and are disposed on a backside of the second trough corresponding to three edges of the second trough.

2. The cassette transport device of claim 1, wherein the second trough is provided with at least two spring-based locking assemblies.

3. The cassette transport device of claim 2, wherein the second trough is provided with four spring-based locking assemblies disposed at respective four corners of the second trough.

4. The cassette transport device of claim 1, wherein the first trough is provided with at least three pin-based locking assemblies.

5. The cassette transport device of claim 4, wherein the first trough is provided with three pin-based locking assemblies disposed to define a triangle.

6. The cassette transport device of claim 1, wherein each of the plurality of cassette trays is further provided with at least one photoelectric sensor on a backside thereof, the at least one photoelectric sensor is configured for detecting presence of cassettes.

7. The cassette transport device of claim 1, wherein the cassette-loading frame is provided with RFID sensors for obtaining ID information of cassettes.

8. The cassette transport device of claim 7, wherein each of the RFID sensors comprises two antennas for obtaining the ID information of the cassettes, one of the two antennas is configured for detecting the cassette of the first size and the other one of the two antennas is configured for detecting the cassette of the second size.

9. The cassette transport device of claim 1, wherein a plurality of buffers are disposed between the smart cart and the base expansion frame.

10. The cassette transport device of claim 1, further comprising a plurality of obstacle avoidance sensors.

11. The cassette transport device of claim 10, the plurality of obstacle avoidance sensors comprises: ultrasonic sensors, horizontal sensors and vertical sensors, the ultrasonic sensors being disposed in symmetry on front and rear sides of the base expansion frame that oppose each other along a direction in which the smart cart travels, the horizontal sensors being disposed in symmetry on left and right sides of the base expansion frame, the vertical sensors being disposed in symmetry on left and right sides of the cassette-loading frame.

12. The cassette transport device of claim 1, wherein the first size is 12 inch and the second size is 8 inch.

* * * * *